US008513075B2

(12) United States Patent
He et al.

(10) Patent No.: US 8,513,075 B2
(45) Date of Patent: Aug. 20, 2013

(54) METHOD FOR MANUFACTURING A SEMICONDUCTOR DEVICE

(75) Inventors: Yonggen He, Beijing (CN); Jingang Wu, Beijing (CN); Haibiao Yao, Beijing (CN)

(73) Assignee: Semiconductor Manufacturing International Corporation, Beijing (CN)

(*) Notice: Subject to any disclaimer, the term of this patent is extended or adjusted under 35 U.S.C. 154(b) by 0 days.

(21) Appl. No.: 13/306,969

(22) Filed: Nov. 29, 2011

(65) Prior Publication Data

US 2013/0032887 A1    Feb. 7, 2013

(30) Foreign Application Priority Data

Aug. 3, 2011   (CN) .......................... 2011 1 0220340

(51) Int. Cl.
*H01L 21/8238* (2006.01)
(52) U.S. Cl.
USPC ........... 438/230; 438/199; 438/231; 438/235; 438/288
(58) Field of Classification Search
USPC ................ 438/230–231, 197–199, 202, 285, 438/494; 257/190–192, 288, 327, 347, 510, 257/E21.09, E29.255, E21.632
See application file for complete search history.

(56) References Cited

U.S. PATENT DOCUMENTS

| 2007/0287244 | A1* | 12/2007 | Shen et al. ................ 438/199 |
| 2008/0153221 | A1* | 6/2008 | Sridhar et al. ............. 438/230 |
| 2009/0246922 | A1* | 10/2009 | Wu et al. .................. 438/231 |
| 2011/0042729 | A1* | 2/2011 | Chen et al. ................ 257/288 |
| 2012/0094460 | A1* | 4/2012 | Cheng et al. .............. 438/299 |
| 2012/0232591 | A1* | 9/2012 | Brabant et al. ............ 606/235 |

* cited by examiner

*Primary Examiner* — Dung A. Le
(74) *Attorney, Agent, or Firm* — Innovation Counsel LLP

(57) ABSTRACT

A manufacturing method for manufacturing a semiconductor device includes depositing a spacer material on a semiconductor substrate, the substrate includes an NMOS region and a PMOS region, each region has a gate formed thereon. The method further includes covering the NMOS region with a first mask, forming a spacer for the PMOS gate by etching the spacer material, forming a recess in the PMOS region by etching, and growing SiGe or SiGe with in-situ-doped B in the recess of the PMOS region to form a PMOS source/drain region. The method further includes performing an anisotropic wet etching on the recess. After growing SiGE or SiGe with in-situ-doped B, the method further includes covering the PMOS region with a second mask and forming a spacer for the NMOS gate by etching the spacer material. The spacer for the PMOS and NMOS gate has a different critical dimension.

14 Claims, 9 Drawing Sheets

METHOD FOR MANUFACTURING A SEMICONDUCTOR DEVICE

CROSS-REFERENCES TO RELATED APPLICATIONS

This application claims priority to Chinese Patent Application No.201110220340.1, filed on Aug. 3, 2011 and entitled "Semiconductor Device and Manufacturing Method thereof", which is incorporated herein by reference in its entirety.

BACKGROUND OF THE INVENTION

1. Field of the Invention

The present invention relates to the field of CMOS process techniques, and more particularly, it relates to a semiconductor device and a manufacturing method thereof.

2. Description of the Related Art

In the advanced CMOS (complementary metal oxide semiconductor) technology, an eSiGe (Embedded SiGe) process is proposed to increase the compressive stress of channel area of a PMOS (P-channel metal-oxide-semiconductor field-effect transistor) device as well as to enhance the carrier mobility thereof, in which, an embedded SiGe is used for forming a source region or a drain region, so as to apply a stress on the channel area, thereby improving the performance of the PMOS. The eSiGe process faces many challenges, and one important factor that should be considered is the selectivity of SiGe (silicon germanium) epitaxial growth. Generally, it is necessary to grow SiGe or SiGe:B (SiGe with in-situ-doped B) in a PMOS recess region, and the functionality of a semiconductor device will be affected if SiGe or SiGe:B grows on undesired regions.

In the prior art, there are two eSiGe integrating process flows. One process flow is referred to as a DSW (disposable sidewall) process flow, which generally comprises forming isolation region (e.g. STI), forming a gate oxide, forming a gate, forming a disposable sidewall, forming a S/D (source/drain) recess and SiGe SEG (selective epitaxial growth), removing the disposable sidewall, forming an offset spacer, performing halo and extension region (Halo & Ext.) ion implantations, forming a SW (sidewall), and performing RTA (rapid thermal annealing), such as millisecond anneal (m-sec anneal). Since eSiGe-S/D is formed prior to the formation of the offset spacer, this process flow is also referred to as "SiGe-first" process flow. The other process flow is referred to as "SiGe-last" process flow, which roughly comprises forming isolation, forming a gate oxide, forming a gate, forming an offset spacer, performing halo and extension region ion implantations, forming a sidewall SW, forming a S/D recess and SiGe SEG, and performing RTA, or the like.

FIGS. 1A-1F schematically show the sectional views of each stage of the SiGe-last process flow in the prior art.

As shown in FIG. 1A, a spacer material SiN 150 is deposited. A Si substrate 100 comprises a STI 110, an NMOS (n-channel metal-oxide-semiconductor field effect transistor) region 120 for an NMOS device, and a PMOS region 130 for a PMOS device, wherein gates 140 are formed on the NMOS region 120 and the PMOS region 130, an oxidation layer 160 is also formed thereon, and SiN is deposited on the oxidation layer 160 as the spacer material.

As shown in FIG. 1B, a sidewall spacer 150 is formed by etching, and the spacer material on other positions of the NMOS region and the PMOS region is removed.

As shown in FIG. 1C, the NMOS region is covered with a photo-resist 170.

As shown in FIG. 1D, a PMOS S/D recess 180 is formed by a dry etching or a combination of a dry etching and a wet etching.

As shown in FIG. 1E, the photo-resist 170 is removed.

As shown in FIG. 1F, SiGe epitaxial growth is performed. However, since the oxide 160 on the NMOS region 120 is relatively thin, SiGe may grow on the NMOS region, which consequently affects the performance of a semiconductor device.

In the SiGe process flow of the prior art, including SiGe-first process flow and SiGe-last process flow, for example, after a wet cleaning process and a SiGe pre-baking process, the thin oxidation layer that covers the NMOS S/D region may fail to protect the NMOS region such that SiGe also grows on the NMOS region. Thus, the growth of SiGe on the NMOS region becomes a major concern.

BRIEF SUMMARY OF THE INVENTION

The inventor of the present invention has discovered above problems of the prior art, and thus, proposes a novel technical solution to address at least one of the problems.

An object of the present invention is to provide a technical solution for a method for manufacturing a semiconductor device.

According to a first aspect of the present invention, there is provided a method for manufacturing a semiconductor device, comprising: depositing a spacer material on a semiconductor substrate, the semiconductor substrate including an NMOS region having an NMOS gate formed thereon and a PMOS region having a PMOS gate formed thereon; covering the NMOS region with a first mask; forming a spacer for the PMOS gate by etching the spacer material; forming a recess in the PMOS region by etching, the recess being used for forming a PMOS source/drain region; after removing the first mask, growing SiGe or SiGe with in situ doped B in the recess to form a PMOS source/drain region.

Preferably, after growing SiGe or SiGe with in situ doped B in the recess, the method further comprises covering the PMOS region with a second mask, forming a spacer for the NMOS gate by etching the spacer material, and removing the second mask.

Preferably, the spacer material is silicon nitride or silicon oxide and silicon nitride deposited on the silicon oxide.

Preferably, the spacer for the PMOS gate and the recess used for forming a PMOS source/drain region are formed by an all-in-one etching process.

Preferably, after forming a recess used for forming a PMOS source/drain region, the method can comprise performing an anisotropic wet etching on the recess.

Preferably, the anisotropic wet etching comprises an etchant having high crystallographic plane selectivity.

Preferably, the etchant having high crystallographic plane selectivity includes TMAH, KOH, or NH$_3$OH.

Preferably, the first mask covering the NMOS region is a first photo-resist while the second mask covering the PMOS region is a second photo-resist of a type opposite to that of the photo-resist of the first mask. The first and the second photo-resist are exposed using a same reticle.

Preferably, the spacer is an offset spacer. After removing the mask that covers the PMOS region, the method further comprises performing a lightly doped drain implantation, and forming a main spacer for the NMOS gate and a main spacer for the PMOS gate.

Preferably, the spacer is a main spacer. Prior to depositing a spacer material on a semiconductor substrate, the method further comprises forming an offset spacer for the NMOS gate and an offset spacer for the PMOS gate, and performing a halo and an extension region ion implantations.

Preferably, the spacer for the PMOS gate and the spacer for the NMOS gate have different critical dimensions.

Preferably, the method further comprises removing the first mask prior to forming a recess.

Preferably, the method further comprises removing the first mask after forming a recess and prior to growing SiGe or SiGe with in-situ-doped B in the recess.

According to a second aspect of the present invention, there is provided a semiconductor device, comprising: a semiconductor substrate, the semiconductor substrate including an NMOS region on which an NMOS gate is formed and a PMOS region on which a PMOS gate is formed; wherein, the NMOS region is covered with a spacer material, a spacer is formed on the sidewall of the PMOS gate, and a recess used for forming a PMOS source/drain region is formed in the PMOS region.

Preferably, SiGe or SiGe:B grows in the recess.

Preferably, the PMOS region is covered with a mask.

Preferably, the spacer material is silicon nitride and the mask is a photo-resist.

Preferably, the spacer is a main spacer or an offset spacer.

An advantage of the present invention is in that, when SiGe or SiGe:B grows in the recess of the PMOS region, the spacer material that covers the NMOS region can protect the NMOS region, such that SiGe or SiGe:B is prevented from growing in the NMOS region.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the attached drawings, the present invention can be more clearly understood based on the following detailed description.

DETAILED DESCRIPTION OF THE INVENTION

Figure 1A:
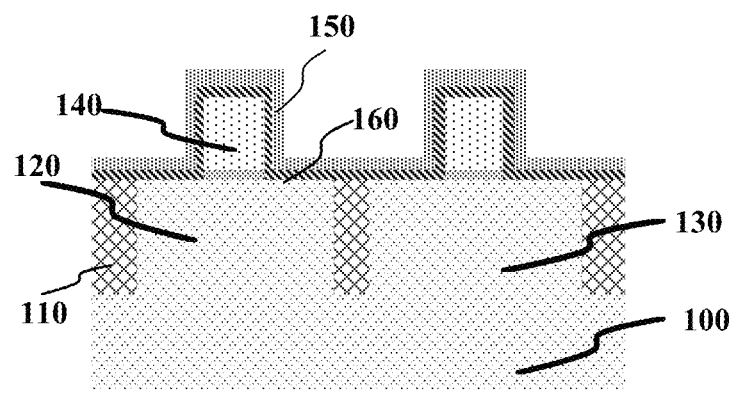
FIGS. 1A-1F schematically show sectional views of each stage of the SiGe-last process flow in the prior art.
Figure 1B:
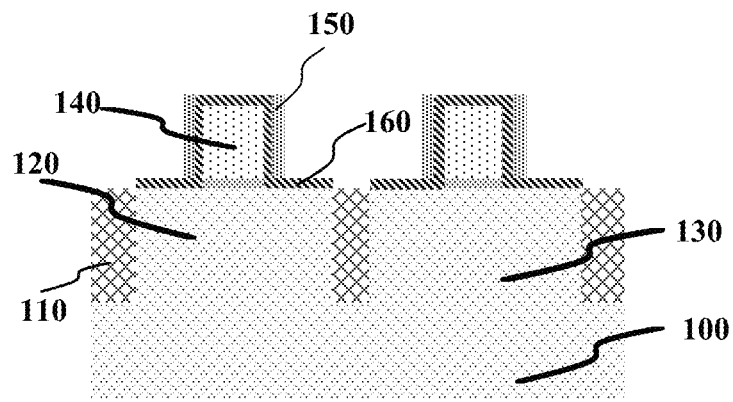
Figure 1C:
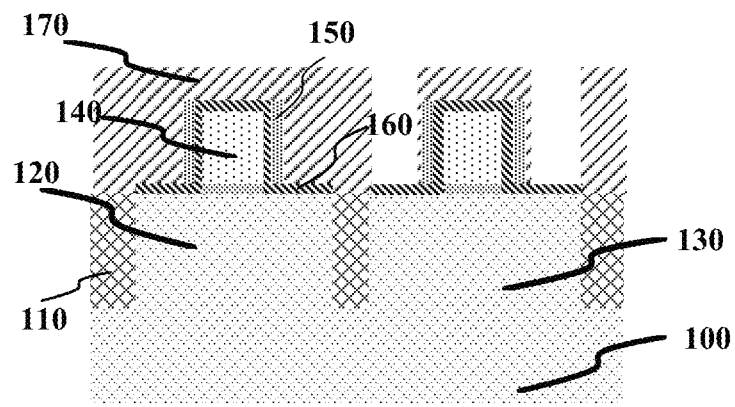
Figure 1D:
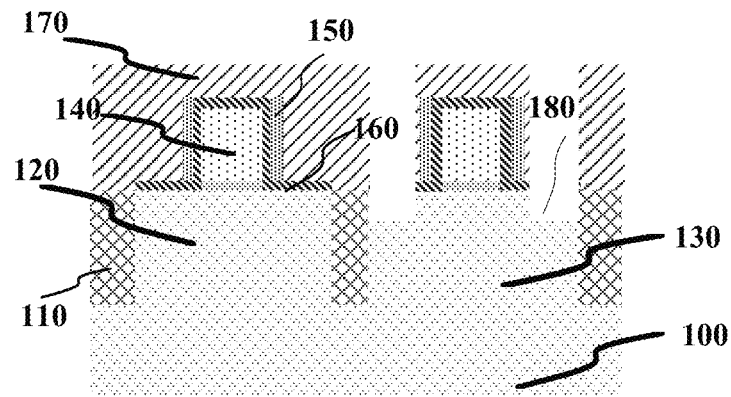
Figure 1E:
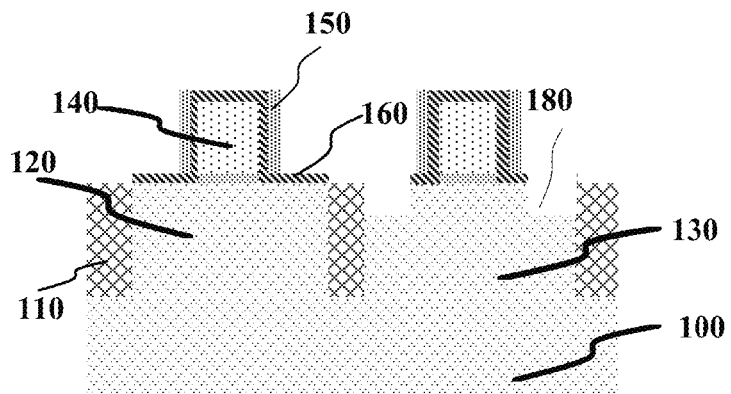
Figure 1F:
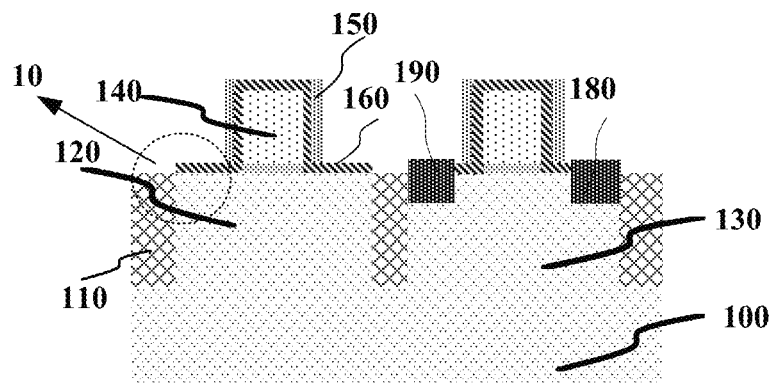

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

Meanwhile, it should be understood that, for the convenience of description, various components shown in the figures are not drawn according to their actual dimension proportion relations.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Figure 2:
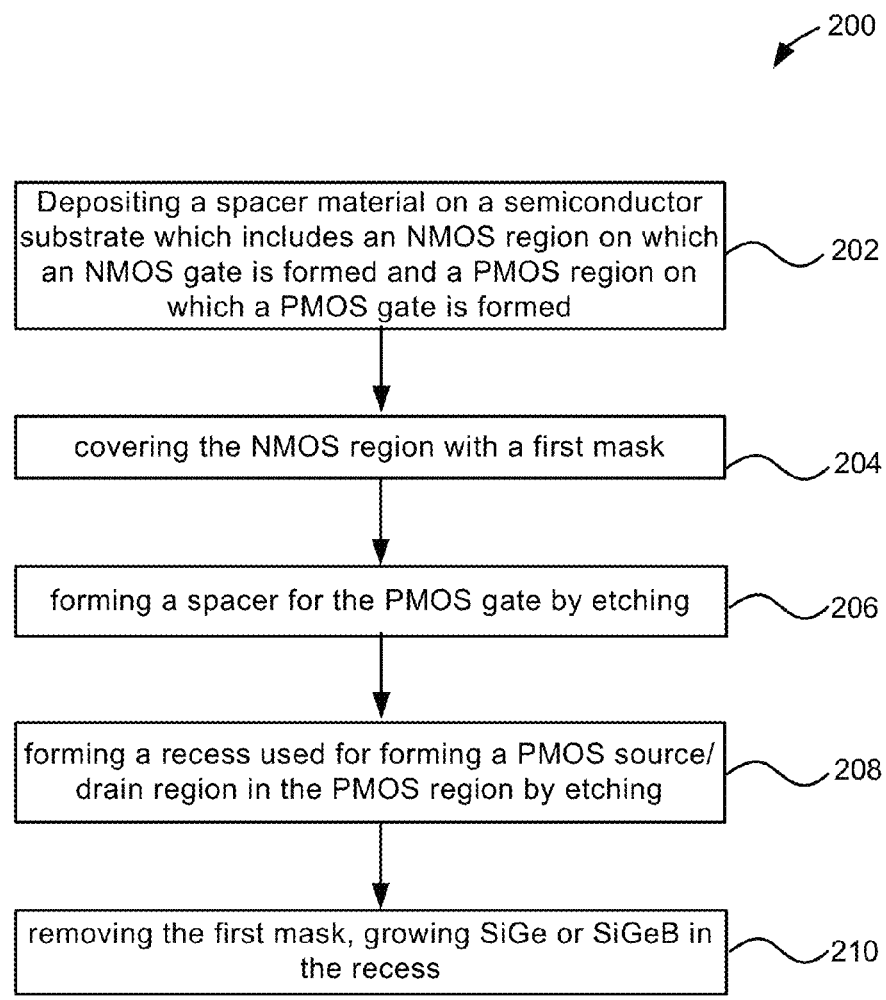
FIG. 2 is a flowchart showing a method for manufacturing a semiconductor device according to one embodiment of the present invention.

FIG. 2 is a flowchart showing a method for manufacturing a semiconductor device according to one embodiment of the present invention.

As shown in FIG. 2, at step 202, a spacer material is deposited on a semiconductor substrate. The spacer material can be, for example, silicon nitride (SiN), or materials including silicon oxide and silicon nitride deposited on the silicon oxide, or other spacer materials known by one of ordinary skill in the relevant art. The semiconductor substrate includes an NMOS region having an NMOS gate formed thereon and a PMOS region having a PMOS gate formed thereon.

At step 204, the NMOS region is covered with a first mask. The first mask can be a photo-resist or a mask formed from a hard mask material.

At step 206, a spacer for the PMOS gate is formed by etching the spacer material. The spacer can be an offset spacer or a main spacer.

At step 208, a P-recess is formed in the PMOS region by etching. For example, a recess of a PMOS source/drain region can be formed by a dry etching using the spacer and PMOS gate as a mask or a Sigma-shaped recess of a PMOS source/drain region can be formed by a dry etching and a subsequent wet etching.

At step 210, after removing the first mask, SiGe or SiGe:B grows in the recess to form a PMOS source/drain region. For example, the step of removing the first mask can be performed prior to forming a recess used for forming a PMOS source/drain region, or after forming a recess and prior to growing SiGe or SiGe:B in the recess.

In the above embodiment, when SiGe or SiGe:B grows in the recess of the PMOS region, the spacer material that covers the NMOS region can protect the NMOS region such that SiGe or SiGe:B is prevented from growing on the NMOS region, which then improves the performance of the semiconductor device.

According to one embodiment of the present invention, after growing SiGe or SiGe with in situ doped B in the recess, the method further comprises covering the PMOS region with a second mask, forming a spacer for the NMOS gate by etching the spacer material, and removing the second mask.

In the above embodiment, the spacer for NMOS gate and the spacer for the PMOS gate are formed respectively. By controlling etching conditions, such as distinct over etch dosage, selective ratio of SiN to oxide, or the like, NMOS and PMOS spacers each having a different critical dimension (CD) can be more easily formed according to device requirements.

In one embodiment, the mask that covers the NMOS region is a first photo-resist, while the mask that covers the PMOS region is a second photo-resist of a type opposite to that of the photo-resist of the first mask. The first photo-resist that covers the PMOS region and the second photo-resist that covers the NMOS region are exposed using a same reticle. Therefore, only one reticle is required to be prepared.

FIGS. 3A-3I schematically show sectional views of each stage of a method for manufacturing a semiconductor device according to one embodiment of the present invention.

Figure 3A:
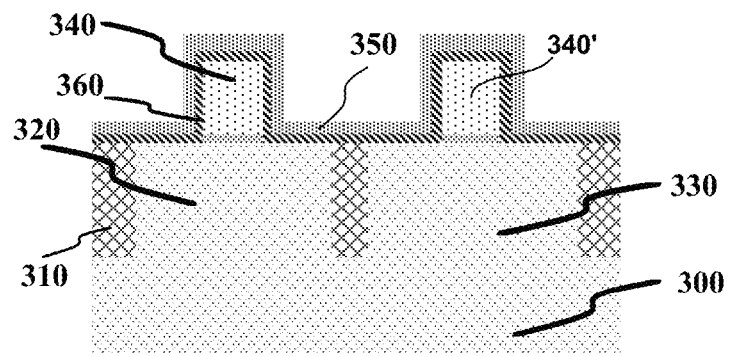
FIGS. 3A-3I schematically show sectional views of each stage of a method for manufacturing a semiconductor device according to one embodiment of the present invention.

As shown in FIG. 3A, a spacer material SiN 350 is deposited. A substrate 300 includes a STI 310, an NMOS region 320, and a PMOS region 330; wherein a gate 140 is formed on the NMOS region 320 and the PMOS region 330, respectively. An oxidation layer 360 is also formed thereon, and the spacer material SiN 350 is deposited on the oxidation layer 360.

Figure 3B:
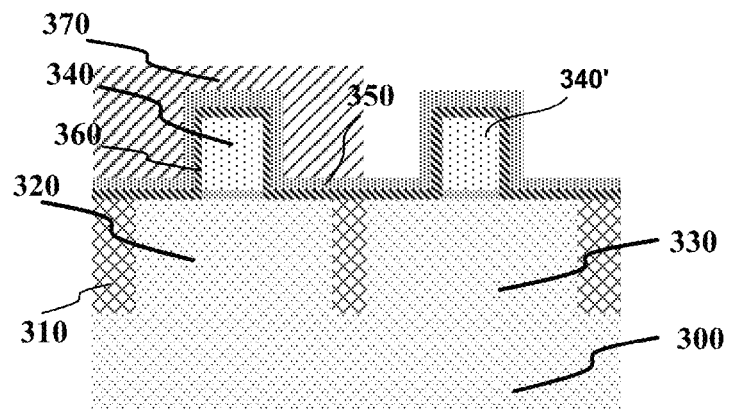

As shown in FIG. 3B, a first mask 370 is formed on the NMOS region so as to substantially expose the PMOS region. The first mask 370 can be, for example, a photo-resist.

Figure 3C:
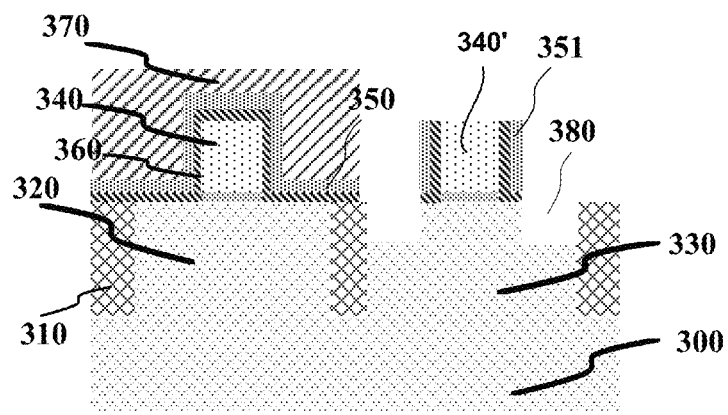

As shown in FIG. 3C, a PMOS main spacer 351 and a PMOS S/D recess 380 are formed by etching. For example, the PMOS spacer 351 and the PMOS S/D recess 380 can be formed by an all-in-one etching process. Alternatively, the PMOS spacer 351 and the PMOS S/D recess 380 can be formed respectively by twice etching.

Figure 3D:
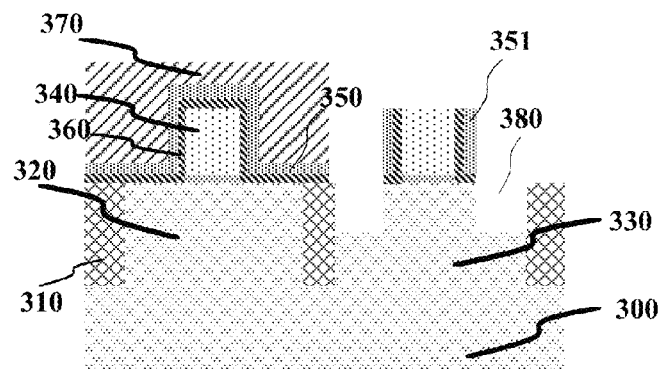

As shown in FIG. 3D, an anisotropic wet etching is performed to the recess 380 such that the recess 380 can have a desirable shape (e.g. Sigma-shape). An etchant with high crystallographic plane selectivity can be used for performing the anisotropic wet etching. The etchant with high crystallographic plane selectivity can include, for example, TMAH, KOH, or NH$_3$OH.

Figure 3E:
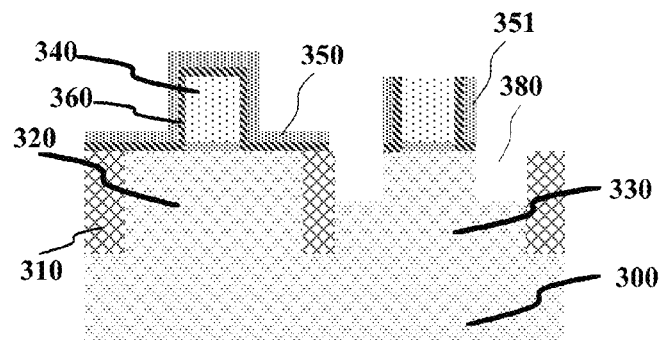

As shown in FIG. 3E, the first mask 370 is removed.

Figure 3F:
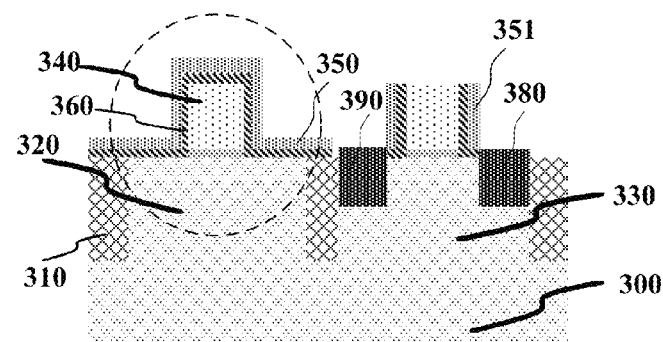

As shown in FIG. 3F, SiGe epitaxial growth is performed in the recess 380 such that SiGe 390 grows in the recess 380.

Figure 3G:
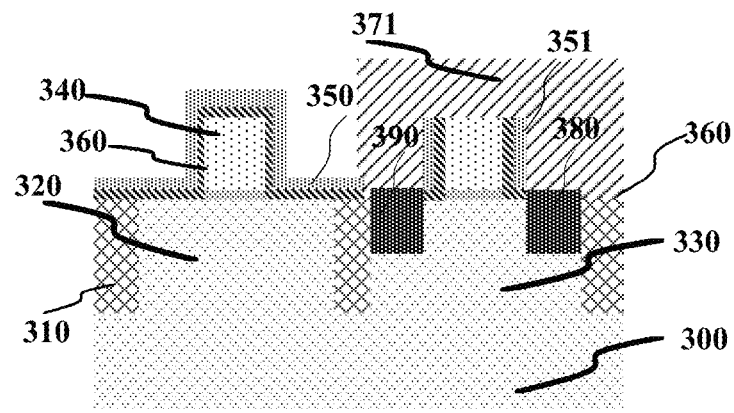

As shown in FIG. 3G, the PMOS region is covered with a second mask 371. The second mask 371 can be, for example, a photo-resist.

Figure 3H:
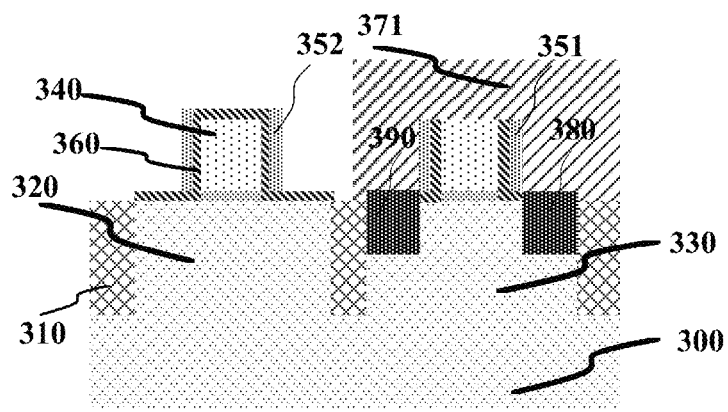

As shown in FIG. 3H, an NMOS main spacer 352 is formed by etching.

Figure 3I:
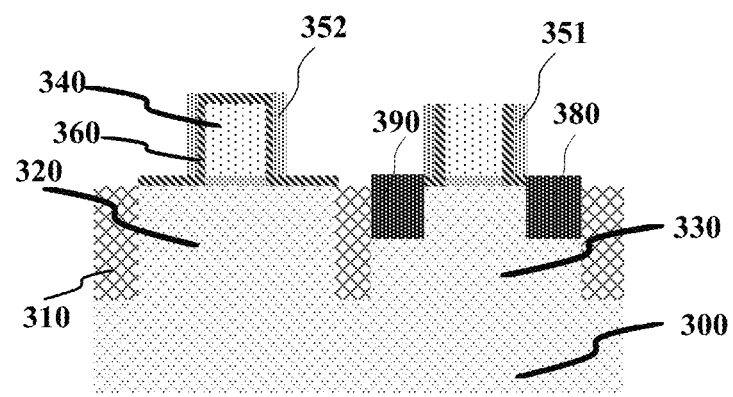

As shown in FIG. 3I, the second mask 371 that covers the PMOS region is removed.

It needs to be pointed out that, the step shown in FIG. 3D is an optional step. In one embodiment, prior to depositing the spacer material on the semiconductor substrate, the method further comprises forming an offset spacer for the NMOS gate and an offset spacer for the PMOS gate, and performing halo and extension region ion implantations.

In the above embodiment, as for the SiGe-last process, when SiGe or SiGe:B grows in the recess of the PMOS region, the spacer material that covers the NMOS region can protect the NMOS region such that SiGe or SiGe:B can be prevented from growing in the NMOS region, thereby improving the performance of the semiconductor device. The main spacer for the PMOS gate and the main spacer for the NMOS gate are formed respectively, such that a semiconductor device having different offset spacer dimensions respectively for the PMOS gate and the NMOS gate can be more easily formed as needed.

FIGS. 4A-4I schematically show sectional views of each stage of a method for manufacturing a semiconductor device according to another embodiment of the present invention.

Figure 4A:
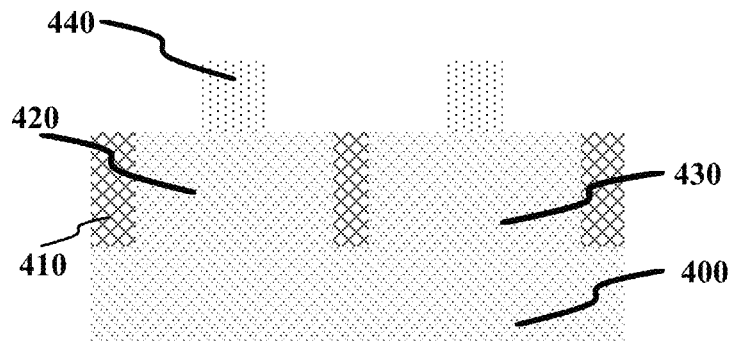
FIGS. 4A-4I schematically show sectional views of each stage of a method for manufacturing a semiconductor device according to another embodiment of the present invention.

As shown in FIG. 4A, NMOS and PMOS gates 440 are formed on a substrate 400. A gate insulation layer (not shown) is formed under gate 440. The substrate 400 includes a STI 410, an NMOS region 420 and a PMOS region 430, and gates 440 are formed on the NMOS region 420 and the PMOS 430 region, respectively.

Figure 4B:
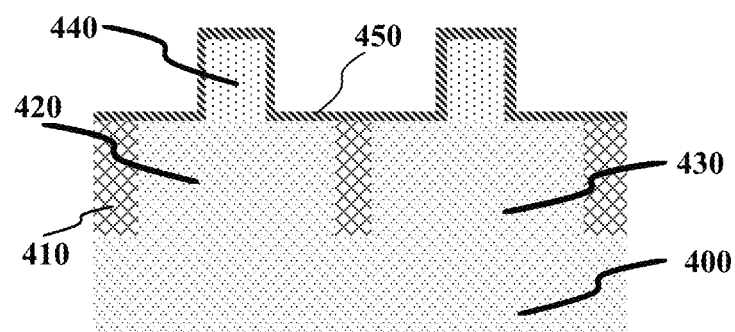

As shown in FIG. 4B, an offset spacer material SiN 450 is deposited.

Figure 4C:
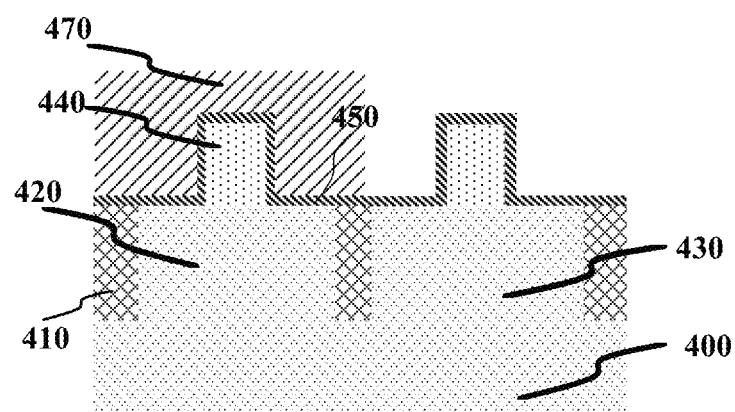

As shown in FIG. 4C, a first mask 470 is formed on the NMOS region. The first mask 470 can be, for example, a photo-resist.

Figure 4D:
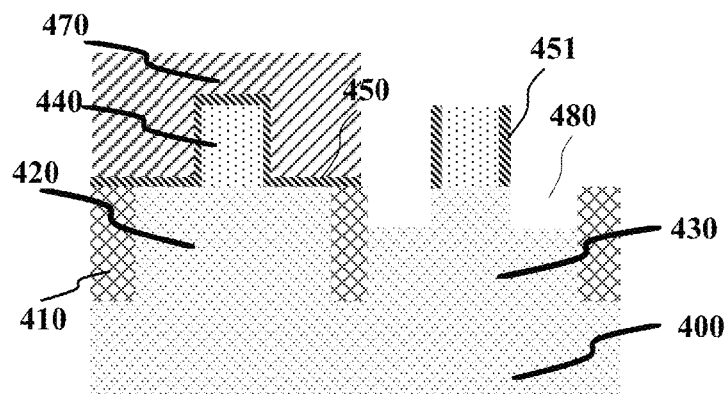

As shown in FIG. 4D, an offset spacer 451 for the PMOS and a PMOS S/D recess 480 are formed by etching the offset spacer material.

Figure 4E:
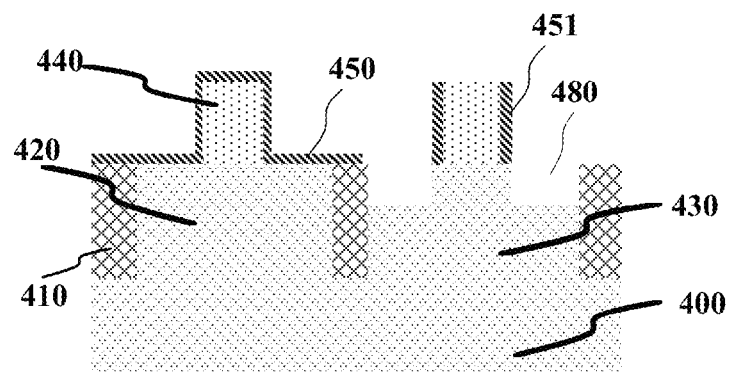

As shown in FIG. 4E, the first mask 470 is removed.

Figure 4F:
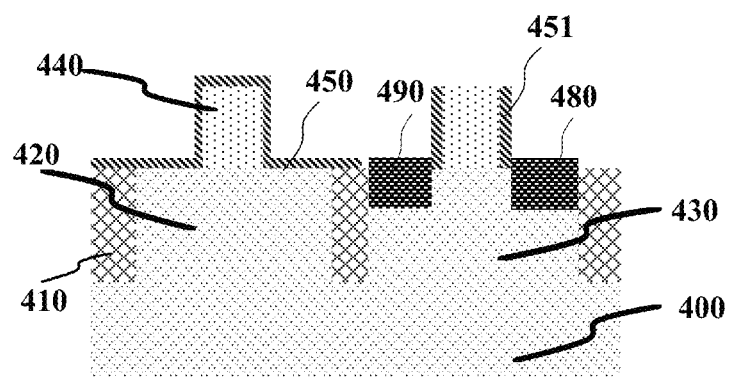

As shown in FIG. 4F, SiGe epitaxial growth is performed in the recess 480 such that SiGe 490 grows in the recess 480.

Figure 4G:
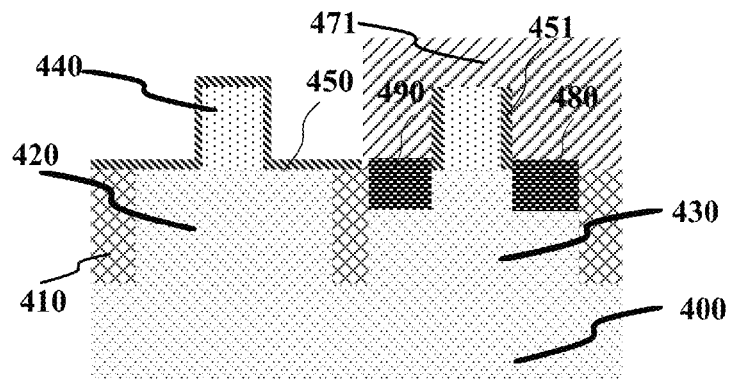

As shown in FIG. 4G, the PMOS region is covered with a second mask 471. The second mask 471 can be, for example, a photo-resist.

Figure 4H:
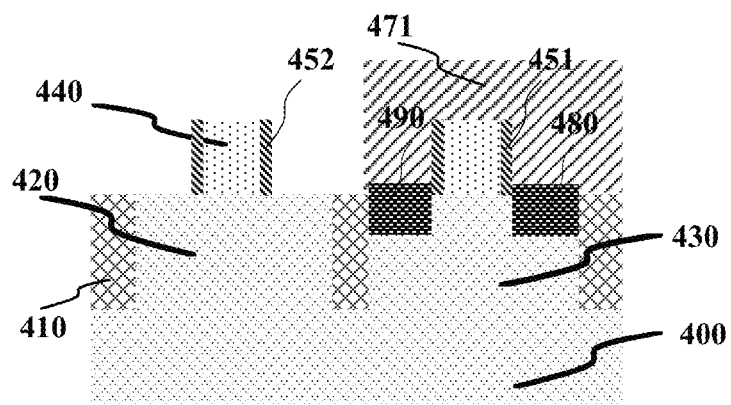

As shown in FIG. 4H, an offset spacer 452 for the NMOS is formed by etching the offset spacer material.

Figure 4I:
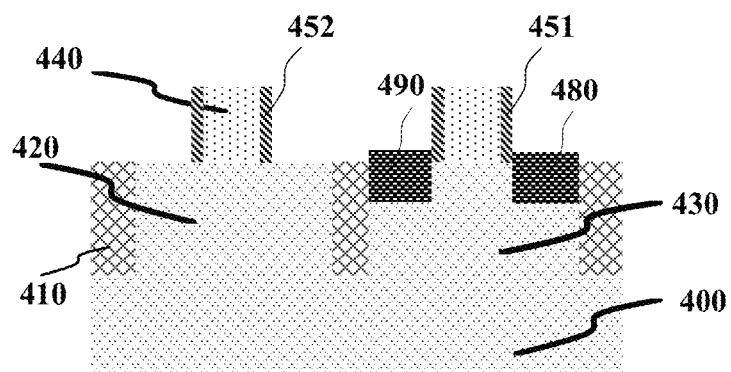

As shown in FIG. 4I, the second mask 471 that covers the PMOS region is removed.

According to one embodiment of the present invention, after removing the second mask that covers the PMOS region, the method further comprises: performing a LDD (lightly doped drain) implantation; forming a main spacer for the NMOS gate and a main spacer for the PMOS gate.

In the above embodiment, as for the SiGe-first process, when SiGe or SiGe:B grows in the recess of the PMOS region, the spacer material that covers the NMOS region can protect the NMOS region such that SiGe or SiGe:B can be prevented from growing in the NMOS region, thereby improving the performance of the semiconductor device. The offset spacer for the PMOS gate and the offset spacer for the NMOS gate are formed respectively, such that a semiconductor device having different offset spacer dimensions respectively for the PMOS gate and the NMOS gate can be more easily formed as needed.

So far, a method for manufacturing semiconductor device according to the present invention as well as a semiconductor device formed thereby has been described in detail. In order not to obscure the concepts of the present invention, some details known in the art are not described. One of ordinary skill in the relevant art can totally understand how to implement the technical solutions disclosed herein based on the above descriptions.

The above statement is given merely for illustration and description, and is not exhaustive, or to limit the invention to the disclosed form. Many modifications and changes are obvious to one of ordinary skill in the relevant art. Embodiments are selected and described for a better illustration of the principle and practical application of this invention, so that those skilled in the art can understand this invention and envisage various embodiments with various modifications suited to specific usages.

What is claimed is:

1. A method for manufacturing a semiconductor device, the method comprising:
   depositing a spacer material on a semiconductor substrate, said semiconductor substrate including an NMOS region having an NMOS gate formed thereon and a PMOS region having a PMOS gate formed thereon;
   covering said NMOS region with a first mask;
   forming a spacer for said PMOS gate by etching the spacer material;
   when etching the spacer material to form said spacer for said PMOS gate, at least partially forming a recess in said PMOS region by etching; and
   growing SiGe or SiGe with in-situ-doped B in said recess to form a PMOS source/drain region.

2. The method according to claim 1 further comprising, after growing SiGe or SiGe with in-situ-doped B in said recess:

covering said PMOS region with a second mask;
forming a spacer for said NMOS gate by etching the spacer material; and removing said second mask.

3. The method according to claim 2, wherein the first mask that covers the NMOS region is a first photo-resist, while the second mask that covers the PMOS region is a second photo-resist of a type opposite to that of the photo-resist of the first mask; the first and second photo-resists are exposed using a same reticle.

4. The method according to claim 2, wherein the spacer for said NMOS gate is an offset spacer.

5. The method according to claim 4 further comprising:
after removing the second mask that covers the PMOS region:
performing a lightly doped drain implantation;
forming a main spacer for said NMOS gate and a main spacer for said PMOS gate.

6. The method according to claim 2, wherein the spacer for said NMOS gate is a main spacer.

7. The method according to claim 6 further comprising:
prior to depositing a spacer material on a semiconductor substrate, forming an offset spacer for said NMOS gate and an offset spacer for said PMOS gate; and
performing a halo implantation and an extension region implantation.

8. The method according to claim 2, wherein the spacer for said PMOS gate and the spacer for said NMOS gate have different critical dimensions.

9. The method according to claim 1, wherein said spacer material is silicon nitride or silicon oxide and silicon nitride deposited on said silicon oxide.

10. The method according to claim 1, wherein said spacer for said PMOS gate and said recess in said PMOS region are formed by a same etching process.

11. The method according to claim 1 further comprising, after partially forming said recess in said PMOS region:
performing an anisotropic wet etching to form a shape of said recess according to a predetermined shape.

12. The method according to claim 11, wherein said anisotropic wet etching comprises using an etchant having high crystallographic plane selectivity, said etchant including TMAH, KOH, or $NH_3OH$.

13. The method according to claim 10 further comprising:
in said same etching process, removing an oxide material that is different from the spacer material.

14. The method according to claim 1, further comprising:
removing the first mask after forming said recess and prior to growing said SiGe or SiGe with in-situ-doped B in said recess.

* * * * *